United States Patent [19]

Francis et al.

[11] Patent Number: 4,927,711
[45] Date of Patent: May 22, 1990

[54] HYBRID CIRCUITS AND THICK FILM DIELECTRICS USED THEREIN

[75] Inventors: Gaylord L. Francis; Francis W. Martin, both of Painted Post, N.Y.

[73] Assignee: Corning Incorporated, Corning, N.Y.

[21] Appl. No.: 289,260

[22] Filed: Dec. 23, 1988

[51] Int. Cl.$^5$ .................. B32B 17/06; B32B 15/20; B32B 18/00
[52] U.S. Cl. .................................... 428/432; 428/195; 428/426; 428/432; 428/698; 428/704; 428/901; 361/397; 174/255
[58] Field of Search ............... 428/426, 432, 195, 698, 428/704, 901; 174/68.5; 357/671; 361/397

[56] References Cited

U.S. PATENT DOCUMENTS

| | | | |
|---|---|---|---|
| 4,714,687 | 12/1987 | Holleran | 501/9 |
| 4,719,187 | 1/1988 | Bardhan | 501/97 |
| 4,775,596 | 10/1988 | Holleran | 428/432 |

Primary Examiner—Jose Dees
Assistant Examiner—Amy Hulina
Attorney, Agent, or Firm—Clinton S. Janes, Jr.; Milton M. Peterson

[57] ABSTRACT

There is disclosed a hybrid circuit embodying a crossover formed on a low expansion substrate of aluminum nitride, mullite or a cordierite-type glass-ceramic. The crossover is a thick film dielectric composed of a glass-ceramic having a primary crystal phase of willemite and a secondary phase of cordierite.

7 Claims, 1 Drawing Sheet

HYBRID CIRCUITS AND THICK FILM DIELECTRICS USED THEREIN

FIELD OF THE INVENTION

This invention is concerned with hybrid circuits and with ceramic dielectrics useful in building such circuits. It is particularly concerned with thermally crystallized glass coatings that are compatible with low expansion substrates in producing hybrid circuits involving crossovers.

BACKGROUND OF THE INVENTION

Alumina ($Al_2O_3$) has been a favored ceramic substrate material for electronic circuitry where long life and high reliability are required. However, for certain high performance applications, sintered alumina substrates have proven less than satisfactory.

While an alumina body can be ground to a smooth finish, it undergoes high shrinkage (about 18%) on firing. Sintered alumina has a relatively high dielectric constant of about 10, which restricts line spacing and may lead to signal delays and noise in operation. A relatively high coefficient of thermal expansion (about $65 \times 10^{-7}/°C.$), as compared to that of silicon chips (about $35 \times 10^{-7}/°C.$), can make it difficult to seal such chips to an alumina substrate. Finally, high firing temperatures (about 1600° C.) are required for co-sintering. This limits the metals that may be employed to molybdenum and tungsten, and excludes silver, copper and gold.

Accordingly, a search has been made for substrate materials having more compatible properties than sintered alumina. In particular, materials having coefficients of thermal expansion not over about $45 \times 10^{-7}$, and hence more closely matched to silicon, and a lower dielectric constant than alumina, have been sought.

Glass-ceramic materials, in particular the cordierite-type, have received considerable attention. Some of the history is reviewed in co-pending application Ser. No. 07/238,574 filed Aug. 31, 1988 and assigned to the assignee of this application. This co-pending application discloses modified cordierite compositions that have superior properties to those of alumina, and that can be sintered below 1,000° C. The latter property permits co-sintering, that is, firing noble metal circuitry and sintering the substrate in one heat treatment.

Aluminum nitride (AlN) and mullite are other ceramic materials that hold considerable promise as substrate material. In addition to a compatible coefficient of thermal expansion, AlN has an exceptionally high thermal conductivity. This permits dissipation of heat from hot spots that tend to develop during circuit operation, and that might otherwise damage the circuitry. U.S. Pat. No. 4,719,187 (Bardhan et al.) describes AlN and an improved method for its production.

The advent of these lower expansion substrate materials has created a need for a new dielectric having compatible expansion characteristics in order to build hybrid circuits involving crossovers.

PURPOSES OF THE INVENTION

A basic purpose of the invention then is to provide thick film dielectrics in hybrid circuits involving crossovers.

Another purpose is to provide such dielectrics having expansion characteristics that are compatible with low expansion substrates, such as aluminum nitride, mullite and cordierite-type glass-ceramics.

A further purpose is to provide improved hybrid circuits having low expansion substrates with coefficients of thermal expansion not over about $45 \times 10^{-7}$, such as aluminum nitride, mullite and cordierite-type glass-ceramics.

SUMMARY OF THE INVENTION

One aspect of the invention is a hybrid circuit comprising at least one layer of a substrate material having a coefficient of thermal expansion not over about $45 \times 10^{-7}$ and selected from the group composed of aluminum nitride, mullite and a cordierite-type glass-ceramic, and having a thick film dielectric adhered to said substrate, said film composed of a glass-ceramic containing willemite as a predominant crystal phase and cordierite as a secondary phase. Preferably, the glass-ceramic has a composition essentially free of $Li_2O$, $Na_2O$ and $K_2O$, and consisting essentially of, in weight percent as calculated on an oxide basis, 15–45% ZnO, 3–15% MgO, 10–30% $Al_2O_3$ and 30–55% $SiO_2$. The dielectric film may take the form of an insulating crossover where additional circuitry needs to be applied to form a hybrid circuit.

PRIOR LITERATURE

In addition to references previously noted in the Background section, the following U.S. Patents are noted:

No. 4,221,047 (Narken et al.) discloses a multi-layered glass-ceramic superstructure with a multi-layered distribution of conductors on a preformed multi-layered glass-ceramic base. The glass-ceramics employed are alpha-cordierite and beta-spodumene type.

No. 4,714,687 (Holleran et al.) discloses the use of glass-ceramics, consisting essentially of 15–45% ZnO, 10–30% $Al_2O_3$ and 30–55% $SiO_2$ and containing willemite as the predominant crystal phase, as substrates in integrated circuit packaging.

GENERAL DESCRIPTION OF THE INVENTION

Figure 1:
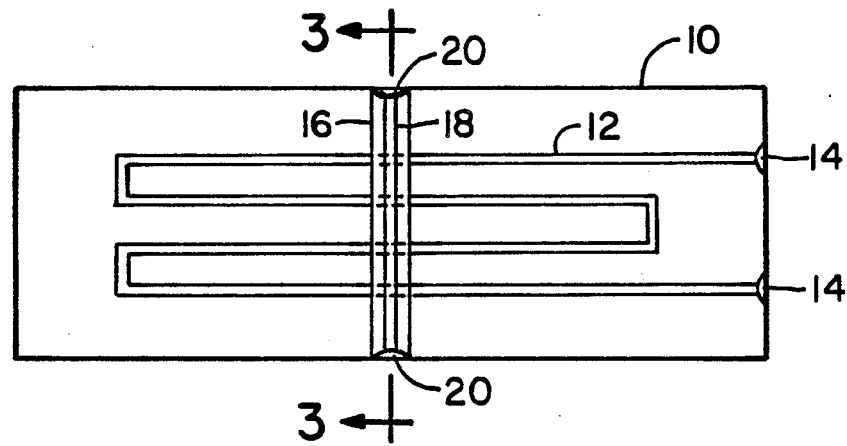
FIG. 1 is a top plan view of a simple form of hybrid circuit showing an overlay.

FIG. 1 is a top plan view illustrating a simple hybrid circuit involving an overlay. The numeral 10 indicates a basic substrate which may be a fired and surfaced body of either aluminum nitride, mullite or a cordierite-type glass-ceramic.

Metallized lines 12 extend between terminals 14, and may be formed with a noble metal metallizing paste. Pastes particularly adapted to matching low expansion substrates are described in our copending application, Ser. No. 273,586, filed Nov. 21, 1988 and entitled METALLIZED SUBSTRATE FOR ELECTRONIC DEVICE.

Figure 2:
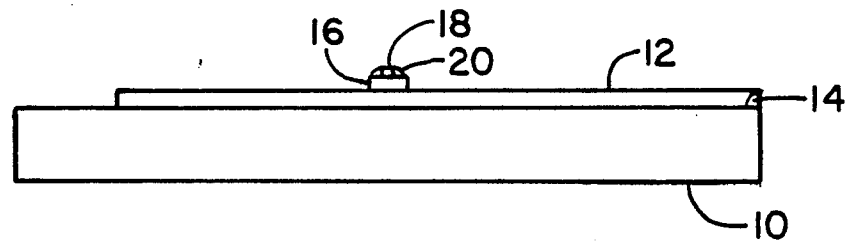
FIG. 2 is a side elevational view of FIG. 1.
Figure 3:
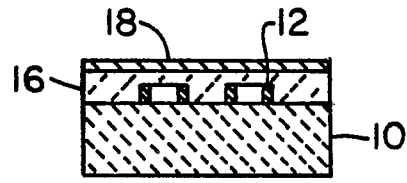
FIG. 3 is a cross-section view taken along line 3—3 of FIG. 1.

As further illustrated in FIGS. 2 and 3, crossover 16 consists of a band of electrically insulating glass-ceramic. It effectively forms a substrate for a further circuit element 18 corresponding to lines 12. This circuit extends across lines 12 and between terminals 20.

Terminals 14 and 20 may be electrodes of a metal such as gold. They may be soldered, or otherwise connected, to other conductive elements. Formation of such contacts is conventional practice.

The present invention is primarily concerned with provision of crossovers in hybrid circuits, as illustrated in FIGS. 1, 2 and 3. Prior glass and glass-ceramic pastes have not provided the necessary combination of properties to match with aluminum nitride, mullite and cordierite-type substrates. This combination of properties includes low coefficients of thermal expansion, low dielectric constants, low loss tangents, and the capability of being fired below 1,000° C. to permit use of noble metal circuitry.

We have now found that glasses that thermally crystallize to produce glass-ceramics with a primary crystal phase of willemite and a secondary phase of cordierite meet the various requirements. These glasses may consist essentially of, in percent by weight as calculated on an oxide basis, 15–45% ZnO, 3–15% MgO, 10–30% $Al_2O_3$ and 30–55% $SiO_2$, and are essentially free of the alkali metal oxides $Na_2O$, $Li_2O$ and $K_2O$. A nucleating agent, selected from 8–12% $ZrO_2$ or 0.001–0.05% of a noble metal selected from Au, Pd, and Pt, may also be present. Other optional constituents include up to 5% $B_2O_3$, up to 5% CaO and/or SrO and/or BaO and/or PbO, up to 7% $Cs_2O$ and up to 15% MnO, providing the total of such optional oxides does not exceed about 15%.

SPECIFIC EMBODIMENTS

A series of four (4) thick film, dielectric pastes was prepared by blending weighed amounts of each of four (4) different powdered glass frits with a screening medium. The screening medium in each case was six (6) percent by weight of ethyl cellulose dissolved in an alcohol solvent. The solvent is available from Eastman Chemical Corp. under the mark Texanol.

Four (4) different glass frits were employed. Each was capable of thermal crystallization to produce a glass-ceramic characterized by a primary crystal phase of willemite and a secondary phase of cordierite.

The frit compositions, as calculated from the batch in parts by weight on an oxide basis, are set forth in TABLE I which follows:

TABLE I

|        | A    | B    | C    | D    |
|--------|------|------|------|------|
| MgO    | 6.6  | 7.2  | 9.9  | 13.8 |
| ZnO    | 37.7 | 39.0 | 26.6 | 18.5 |
| $Al_2O_3$ | 17.8 | 14.3 | 19.4 | 23.2 |
| $SiO_2$   | 37.6 | 39.5 | 44.1 | 44.4 |

Each composition was mixed as a glass batch based on the corresponding oxides. The glass batches were melted at 1550° C., chilled and granulated, and ball milled with alumina balls to an average particle size of about 3.3 microns. Each glass was blended in powdered form with the screening medium to produce a pasty mixture. Each mixture was homogenized to a smooth paste in a three-roll mill for about five (5) minutes. The pastes were in the proportion of 60 wt. % of glass frit to 40 wt. % of screening medium. However, the screening medium may vary from as little as 10 wt. % up to 50 wt. % depending on the viscosity desired.

The pastes thus produced were applied over the surfaces of two different types of low expansion substrates. These were in the form of presintered strips of either aluminum nitride (AlN) or a cordierite-type glass-ceramic having the following composition in calculated weight percent: 51.0% $SiO_2$, 24.8% $Al_2O_3$, 13.1% MgO, 3.1% BaO, 1.4% $B_2O_3$ and 6.6% ZnO.

The paste-coated sustrates were fired at 950° C. Each substrate sample had an adherent, non-porous, glass-ceramic coating formed on its surface. The coated samples were thermally cycled several times between +125° C. and −55° C. without cracking or spalling being observed.

A paste based on composition B, our preferred composition, provided a crack-free coating when fired at 925° C. Accordingly, this paste was employed with gold electrodes on a cordierite substrate to produce a capacitor-type construction for use in checking electrical properties.

In the construction, a thick film gold electrode (Englehard A-3360) was silk screened on the substrate and fired at 925° C. Four coats of the paste prepared from composition B were screened over the gold electrode, with each coat being dried at 125° C. before applying the succeeding coat. The coated substrate was then fired at 925° C., followed by application of a top electrode corresponding to the bottom electrode.

Measurements made on the capacitor structure thus produced provided the following data:

| Fired thickness | 47 microns |
|---|---|
| Breakdown voltage | over 1000 volts/mil. |
| Dissipation factor | 0.003 from 1 khz to 1 mhz |
| Dielectric constant | app. 7.5 from 1 khz to 1 mhz |

Similar data was obtained with a similar construction on an AlN substrate.

We claim:

1. A hybrid circuit comprising a substrate composed of a material having a coefficient of thermal expansion not over about $45 \times 10^{-7}$/°C. and selected from aluminum nitride, mullite and a cordierite glass-ceramic, and a thick film dielectric coated on the surface of said substrate, wherein the thick film dielectric has a composition essentially free of $Na_2O$, $Li_2O$ and $K_2O$ and consists essentially of, in percent by weight as calculated on an oxide basis, 15–45% ZnO, 3–15% MgO, 10–30% $Al_2O_3$, and 30–55% $SiO_2$ said film composed of a glass-ceramic having a primary crystal phase of willemite and a secondary phase of cordierite.

2. A hybrid circuit in accordance with claim 1 wherein the thick film dielectric forms a crossover.

3. A hybrid circuit comprising a substrate composed of a material having a coefficient of thermal expansion not over about $45 \times 10^{-7}$/°C. and selected from aluminum nitride, mullite and a cordierite glass-ceramic, metallized circuitry applied over a portion of a surface of said substrate, a layer of electrically insulating, thick film dielectric coated on the substrate and covering at least a portion of the circuitry, wherein the thick film dielectric has a composition essentially free of $Na_2O$, $Li_2O$ and $K_2O$, and essentially consists of, in percent by weight of an oxide basis, 15–45% ZnO, 3–15% MgO, 10–30% $Al_2O_3$, and 30–55% $SiO_2$ said dielectric being composed of a glass-ceramic having a primary crystal phase of willemite and a secondary phase of cordierite.

4. A hybrid circuit in accordance with claim 3 wherein the metallized circuitry is composed of a fired noble metal paste.

5. A hybrid circuit in accordance with claim 3 wherein the thick film dielectric is in the form of a band crossing over the metallized circuitry on the substrate.

6. A hybrid circuit in accordance with claim 3 wherein the thick film dielectric carries a metallized circuit on its surface.

7. A hybric circuit in accordance with claim 5 wherein the crossover band of thick film dielectric carries a circuit composed of a fired noble metal paste.

* * * * *